United States Patent [19]
Uzoh

[11] Patent Number: 6,126,806
[45] Date of Patent: *Oct. 3, 2000

[54] ENHANCING COPPER ELECTROMIGRATION RESISTANCE WITH INDIUM AND OXYGEN LAMINATION

[75] Inventor: Cyprian E. Uzoh, Beacon, N.Y.

[73] Assignee: International Business Machines Corporation, Armonk, N.Y.

[ * ] Notice: This patent is subject to a terminal disclaimer.

[21] Appl. No.: 09/203,928

[22] Filed: Dec. 2, 1998

[51] Int. Cl.$^7$ ............................. C25D 5/10; C25D 7/12; C25D 5/50; C23C 28/00; C23C 28/02
[52] U.S. Cl. .................. 205/182; 205/170; 205/176; 205/157; 205/184; 205/183; 205/192; 205/224; 205/228
[58] Field of Search .................. 205/157, 184, 205/176, 182, 183, 192, 224, 228; 427/372.2, 404; 428/544

[56] References Cited

U.S. PATENT DOCUMENTS

| | | | |
|---|---|---|---|
| 4,661,416 | 4/1987 | Mizuhara | 428/606 |
| 4,814,049 | 3/1989 | Helton et al. | 204/44.2 |
| 5,071,518 | 12/1991 | Pan | 205/122 |
| 5,098,860 | 3/1992 | Chakravorty et al. | 437/195 |
| 5,106,461 | 4/1992 | Volfson et al. | 205/125 |
| 5,213,638 | 5/1993 | Mahulikar et al. | 148/627 |
| 5,308,796 | 5/1994 | Feldman et al. | 437/200 |
| 5,320,689 | 6/1994 | Mahulikar et al. | 148/436 |
| 5,385,661 | 1/1995 | Andricacos et al. | 205/239 |
| 5,913,147 | 6/1999 | Dubin et al. | 438/687 |

FOREIGN PATENT DOCUMENTS 64-64338  3/1989  Japan .

*Primary Examiner*—Kathryn Gorgos
*Assistant Examiner*—Edna Wong
*Attorney, Agent, or Firm*—Ratner & Prestia; Tiffany L. Townsend

[57] ABSTRACT

A process and structure for enhancing electromigration resistance within a copper film using impurity lamination and other additives to form intermetallic compounds to suppress metal grain boundary growth and metal surface mobility of a composite copper film. The present invention provides an alloy seed layer and laminated impurities to incorporate indium, tin, titanium, their compounds with oxygen, and their complexes with oxygen, carbon, and sulfur into other films. The intermetallics form and segregate to grain boundaries during an annealing process to reduce copper atom mobility. A further aspect of the present invention is the use of high-temperature, inter-diffusion of additives included in an alloy seed layer to form a barrier layer by combining with materials otherwise unsuitable for barrier material functions.

32 Claims, 7 Drawing Sheets

ENHANCING COPPER ELECTROMIGRATION RESISTANCE WITH INDIUM AND OXYGEN LAMINATION

FIELD OF THE INVENTION

The present invention relates to a process and structure for producing electromigration-resistant interconnect films used in semiconductor chips and packages. More particularly, the present invention is related to processes and structures used to enhance the electromigration resistance of plated metal interconnect films, such as electroplated copper, by enhancing the microstructure of metal films formed for use in chip wiring and packaging applications. Indium, tin, titanium, their compounds with oxygen, and their complexes with oxygen, carbon, and sulfur are incorporated into the films to suppress metal grain boundary growth and metal surface mobility.

BACKGROUND OF THE INVENTION

Aggressive device scaling and interconnection ground rules are challenging the physical limits of materials, processes, and structures in the semiconductor industry. For wiring patterns formed on semiconductor chips and packages, copper has emerged as the metallurgy of choice because of various beneficial properties. Despite the various advantages of copper, the electromigration lifetime of a copper film depends strongly on the processes used to form the copper film. For example, the activation energy required to create failures, due to electromigration of a copper film, typically ranges from 0.7 to 1.0 eV. It is desirable to produce a copper-containing film in which the activation energy required to cause failure is increased beyond 1.3 eV. It is further desirable to produce such a film without major processing modifications and without the addition of multiple processing steps. It is also desirable to produce such a film without bringing about any performance degradation.

The thermo-mechanical, electrical, and metallurgical properties, microstructure, and etching characteristics of a film depend on the process used to produce the film. More specifically, these qualities depend upon the microstructure of the metal film so produced. The microstructure of the metal film is enhanced when dopant impurity materials are disposed along the grain boundaries of the film. These impurities help to suppress grain growth and grain recovery within the film. Uncontrolled grain recovery and grain growth may cause defects during subsequent processes, in addition to compromising the qualities noted above.

The presence of partially soluble and insoluble intermetallic materials within a heat-treated metal film produce a microstructure which includes a high twinning density (multiple twins per grain). These intermetallic materials will be preferentially segregated along grain boundary regions and near the surface of the copper-containing film. The presence of these partially soluble and insoluble intermetallic materials, along copper grain boundaries and near the copper surface, reduces copper grain boundary mobility and the mobility of copper atoms along the surface. The interaction of the impurities and the high twinning density formed within the copper microstructure enhances the electromigration lifetime of the entire film structure being used as an interconnect material. This enhancement occurs because such a structure requires more energy to cause atomic migration preferentially in any given direction. Electromigration failures happen when significant atomic migration occurs preferentially in one direction.

What is needed is an improved process and structure, for producing a copper film used as a wiring interconnection material, offering increased resistance to electromigration failures.

SUMMARY OF THE INVENTION

The present invention addresses the shortcomings of the conventional art by replacing the conventional seed layer used in electrodeposition processes with an alloy seed is layer having a copper alloy which may include copper, indium, tin, titanium, and chromium. After the seed layer is formed on a substrate, a copper film is formed on the seed layer. Within or on top of the bulk copper film, an impurity film with comparatively large amounts of impurities such as oxygen, sulfur, nitrogen, and carbon is laminated. After the in-situ impurity electro-lamination is completed, additional films may be added to form a composite interconnect film which includes copper. After the composite film structure is completed, the substrate is annealed. During the annealing process, impurity compounds such as indium oxide, tin oxide, and their complexes are formed as the additives from the alloy seed layer combine with the oxygen, for example, included in the high impurity content laminated film.

The presence of high temperature intermetallic compounds such as indium oxide and other oxides, segregated to the grain boundaries of the copper film, dramatically reduces grain boundary and surface diffusion and mobility. This reduction in copper atom mobility increases the electromigration resistance and the electromigration lifetime of a newly formed copper-containing film. A further aspect of the present invention is the use of high temperature interdiffusion of an additive, included in an alloy seed layer, to form a barrier layer by combining with materials otherwise unsuitable for barrier material functions. The addition and formation of such a barrier material improves various electromechanical aspects of the film formed.

The present invention provides various processes and structures which improve the electrical, metallurgical, thermo-mechanical, and other properties of copper-containing films. By its nature, copper has a short electromigration lifetime. A pure copper film is highly susceptible to rapid grain growth and particularly high surface mobility at comparatively moderate temperatures. One process of the present invention to enhance the electromigration of a copper thin film is to add impurities, which retard grain growth and surface mobility. A preferred process for accomplishing this result is to laminate impurities into the structure of a deposited metal film. The laminated impurities within the metal interact, in turn, with other species in the metal composite film to form high temperature compounds. The high temperature compounds are not readily soluble in copper; rather, they segregate preferentially to copper grain boundaries where they retard grain boundary growth and copper surface mobility during the application of electromotive forces. This retardation increases the electromigration lifetime of the film.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

FIG. 1 is a cross-sectional view showing a substrate after an alloy film has been added;

FIG. 2 is a cross-section showing a copper-containing film added to the structure of FIG. 1;

FIG. 3 is a cross-section showing a roughened surface formed on the copper-containing film;

FIG. 4 is a cross-section showing a high impurity content film laminated onto the copper-containing film;

FIG. 5 is a cross-section showing the structure after a further copper-containing film has been added;

FIG. 6 is a cross-section showing the structure as in FIG. 5 after it has been heat-treated; and FIG. 7 is a cross-section showing a composite metal film of one exemplary embodiment of the present invention.

FIG. 11 is a cross-sectional view showing an alloy seed layer film formed on a substrate;

FIG. 12 is a cross-sectional view showing a roughened surface formed on the alloy seed layer;

FIG. 13 is a cross-sectional view showing the structure after a laminated impurity film and a bulk metal film have been added;

FIG. 14 is a cross-sectional view showing the effects of heat-treating the structure; and FIG. 15 is a cross-sectional view showing a composite film of another exemplary embodiment of the present invention.

DETAILED DESCRIPTION OF THE INVENTION

Figure 1:
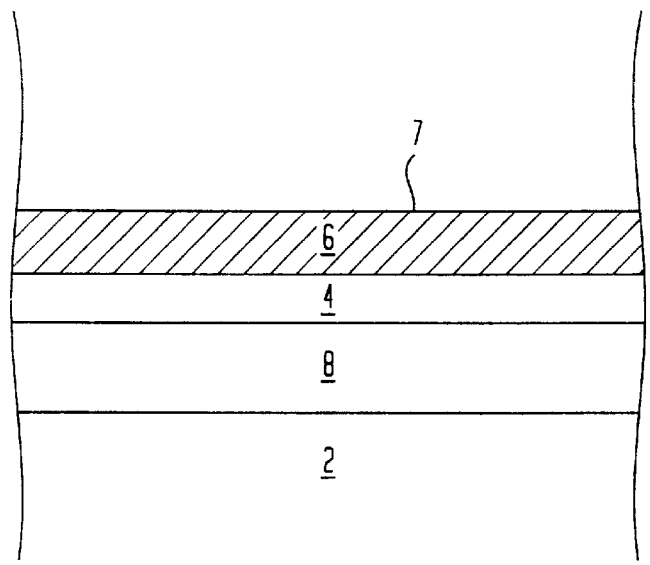
FIG. 1 through FIG. 7 are cross-sections showing the process sequence used to form an exemplary embodiment of the present invention. More specifically.

The process of the present invention is directed generally to forming multiple films in sequence to form a single composite film structure. In the preferred embodiment, a bulk metal film is formed by electroplating, but other suitable processes for depositing a metal film may be used. Before the formation of the bulk metal film, the present invention includes the formation of an electroplating seed layer which includes copper and an additive. An electroplating solution may be used to form a surface microstructure which includes high crystallographic index planes on the bulk film or films. In addition, a film with a high impurity content may be laminated onto the microstructure of the surface which forms the interface between sequentially deposited metal films. This high impurity content laminated film may be formed from the same electroplating solution used to form a bulk film.

Heat treating processes urge the diffusion of the additive from the alloy seed layer and the interaction between the additive from the seed layer and further additives or impurities such as the interaction with impurity materials from the laminated impurity film. In this manner, the additives from the alloy seed layer can be used to form compounds along copper grain boundaries which enhance the electromigration resistance of the film, or they may combine with other materials, which would otherwise be unsuited for barrier layer purposes, to form an effective barrier layer.

The composite copper-containing films formed according to the process of the present invention may be patterned to serve as interconnection wires for application in semiconductor chips or packages. There are at least three well-known procedures for forming such a wiring pattern from the composite films formed according to the various examples of the present invention. One such example for forming a pattern includes the "plate-through" process.

In the plate-through process, a photoresist pattern is formed on a substrate. Next, the sequence of films is deposited selectively on areas of the substrate surface which are not masked by photoresist. After the composite film is formed, the photoresist is removed thus producing a wiring interconnection pattern of the composite metal film.

The second commonly used process includes providing a substrate, then forming the composite copper-containing film on the substrate. After the complete composite film is formed, a photoresist pattern is created on top of the composite film. Next, etching processes are used to remove the exposed sections of the composite film which are not protected by the photoresist pattern thereby producing the wiring interconnection pattern. The photoresist is then removed.

A third and most favored procedure used in the modern processing industry includes the damascene process for forming interconnection patterns. In the damascene process, an insulating dielectric material is formed on the substrate and grooves are formed to create a pattern within the material. The composite metal film is then formed on the dielectric material, filling the trenches formed within the dielectric material. After the composite film formation is complete, the overburden of the composite metal film is removed from the upper surfaces of the dielectric material, thereby producing a wiring pattern of the composite metal film which remains within the trenches.

It should be understood by one skilled in the art that the composite film structures produced, according to the process of the present invention, may be subsequently formed into wiring patterns by either of the above three processes. In addition, any other process known to the art, to create a wiring pattern from a composite metal film, may be used. As such, the exemplary embodiments of the present invention will not be described in conjunction with any specific process for forming a wiring pattern using the composite film of the present invention.

The following examples are included to more clearly demonstrate the overall nature of the invention. These examples are exemplary, not restrictive, of the invention.

Example 1

Combination with Laminated Impurities

In this exemplary embodiment of the process used to form the composite copper-containing film of the present invention, the composite film is formed upon a substrate. Referring to FIG. 1, the substrate 2 may be a semiconductor wafer in the preferred embodiment. A dielectric insulating layer 8 may be formed on the semiconductor substrate 2. In the preferred embodiment, a barrier layer film 4 may be formed on the dielectric layer 8. The barrier layer film 4, however, is not required. When a barrier layer film 4 is used, any suitable barrier material may be used. Likewise, any procedure common to the art may be used to form the barrier layer film 4 on the dielectric layer 8 which is formed on substrate 2.

Next, a plating base film is formed on the substrate 2. The plating base film comprises a copper alloy seed layer 6 which may include copper-indium, copper-tin, copper-titanium, or copper-chromium. The concentration of the indium, tin, titanium, or chromium additive within the alloy may lie within the range of 0.01 to 5.0 atomic percent, but preferably is between 0.08 to 3 atomic percent. Any process suitable in the art to form the alloy seed layer 6 may be used. For example, the alloy seed layer 6 may be formed through evaporation, sputtering, co-sputtering, immersion-plating, and electroplating processes. The thickness of the copper alloy seed layer 6 may range from 100 to 3,000 angstroms and, in the preferred embodiment, may range from 250 to 1,800 angstroms. Copper alloy seed layer 6 has a surface 7.

After the barrier layer film 4 and the copper alloy seed layer 6 have been formed on the semiconductor substrate 2, the substrate 2 may require an initial cleaning operation before the deposition of the bulk copper-containing film. The necessity of the cleaning operation is determined by the cleanliness of the substrate 2 and also the thickness and composition of the copper alloy seed layer 6: the copper alloy seed layer 6 will be partially etched, during the cleaning operation, and the impurity additive within the copper alloy seed layer 6 may be preferentially etched.

The semiconductor substrate 2 may cleaned by etching in a sulfuric acid solution. The sulfuric acid concentration of the cleaning solution may range from 1 percent to 15 percent sulfuric acid in de-ionized water, but preferably may be within the range of 2 to 8 percent. The immersion time in the sulfuric acid solution may vary from 0 to 30 seconds, most preferably less than 10 seconds. This immersion is followed by rinsing in de-ionized water before the formation of the bulk copper-containing film. When the copper alloy seed layer 6 is thin and the substrate 2 is already sufficiently clean, this pre-cleaning step before formation of the bulk film may be bypassed.

Figure 2:
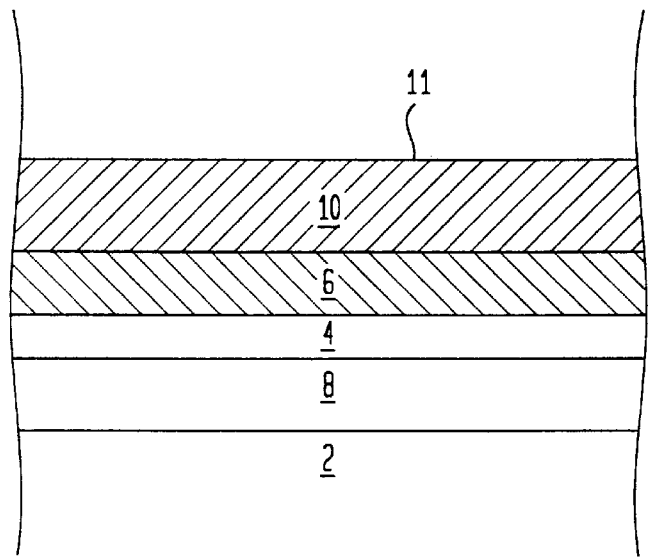

Now turning to FIG. 2, a bulk copper-containing film 10 is deposited on the top of copper alloy seed layer 6. Bulk copper-containing film 10 has an exposed surface 11. The bulk copper-containing film 10 may be deposited by electroless plating, physical vapor deposition (PVD), chemical vapor deposition (CVD), or electroplating processes or various combinations of these processes.

In the case of electroplating, the substrate is electroplated in a suitable electroplating bath, containing impurity additives, as follows. The substrate is immersed in a plating cell in which the plating solution may be agitated with respect to the substrate. The substrate may be exposed to the plating solution for a brief period of time before the application of an electrical potential to the substrate. This brief dwell time may vary from 0 to 20 seconds but, in the preferred embodiment, may be within the range of 0 to 10 seconds. During this time period, the substrate may be preferably rotated at 10 to 400 rpm.

When an acid copper plating bath is used, in addition to copper sulfate pentahydrate and sulfuric acid, other additives may be included such as chloride ions, MD, and $ML_O$. MD and $ML_O$ are commercially available plating bath additives common in the plating industry. The copper sulfate pentahydrate concentration within the solution may vary from 20 to 130 grams/liter. In the preferred embodiment, the concentration range lies within 35 to 110 grams/liter. The sulfuric acid content of the bath may range from 100 to 230 grams/liter and, in the preferred embodiment, the sulfuric acid content ranges from 150 to 210 grams/liter.

With respect to chloride ions as additives, the plating bath concentration may vary from 25 to 180 parts per million, and lies within the range of 45 to 130 parts per million in the preferred embodiment. With respect to additive MD, the concentration may range from 2 to 18 milliliters/liter and, in the preferred embodiment, is within the range of 4 to 16 milliliters/liter. With respect to the concentration of additive $ML_O$ within the bath, the concentration range of the preferred embodiment is between 0.5 to 3.5 milliliters/liter, but may range from 0.3 to 4.5 milliliters/liter.

After the brief dwell period within the plating solution, the plating process is initiated. During the plating process, the electroplating current density may range from 5 to 60 $MA/cm^2$. In the preferred embodiment, this current density may range from 10 to 40 $mA/cm^2$ and most desirably within the range of 10 to 30 $mA/cm^2$. The anode material used may consist of a CuP alloy, as typically used in copper electrodeposition. The plating surface of the substrate may be plated facing downward, and rotation may be used as an additional source of agitation during the electroplating process. The substrate may be rotated at a rate of 10 to 500 rpm, but most preferably within the range of 10 to 180 rpm. In the preferred embodiment, the desired rotation rate will range from 30 to 120 rpm during the plating operation. The electrodeposition is carried out by rendering the substrate a cathode for 5 to 40 seconds, preferably 5 to 30 seconds, to form an electroplated film which will comprise one layer of the composite film of the present invention, and is shown as bulk copper-containing film 10 in FIG. 2.

The impurity content of the various additives formed within the electrodeposited, bulk copper-containing film 10, may be as follows:

|          | Impurity Content | Preferred Impurity Content |
|----------|------------------|----------------------------|
| Carbon   | 3-120 ppm        | 3-75 ppm                   |
| Oxygen   | 0-100 ppm        | 0-30 ppm                   |
| Chlorine | 2-200 ppm        | 2-100 ppm                  |
| Nitrogen | 0-100 ppm        | 0-30 ppm                   |
| Sulfur   | 1-60 ppm         | 1-15 ppm                   |

Table 1. Impurity Concentration in the Plated Film (in parts per million)

The formation of the composite film of the present invention is continued by performing a spin-and-etch operation to roughen surface 11 of bulk copper-containing film 10. As above, bulk copper-containing film 10 may be formed in alternative embodiments by electroless plating, PVD, CVD, or other suitable processes for the formation of metal films. In the alternative embodiments, the process is continued by contacting the bulk copper-containing film 10 with the same electroplating solution as described in conjunction with the preferred embodiment of electrodeposition. In the preferred embodiment, the substrate is removed from the electroplating solution.

In either embodiment, with the electroplating solution disposed on the surface of the substrate, the substrate is next spun at a rate of 20 to 1800 rpm, preferably in the range of 300 to 1200 rpm, to completely spin the plating solution off the substrate surface. The spin time may range from 5 to 60 seconds and, in the preferred embodiment, may be 10 to 50 seconds. This operation also simultaneously etches a unique microstructure onto the substrate surface. The presence of oxygen in the ambient environment, within which this spinning operation is performed, accelerates the creation of the unique microstructure formed within the exposed copper-containing film surface. In the preferred embodiment, the operation takes place in air, but other oxygen-containing environments may be used.

Figure 3:
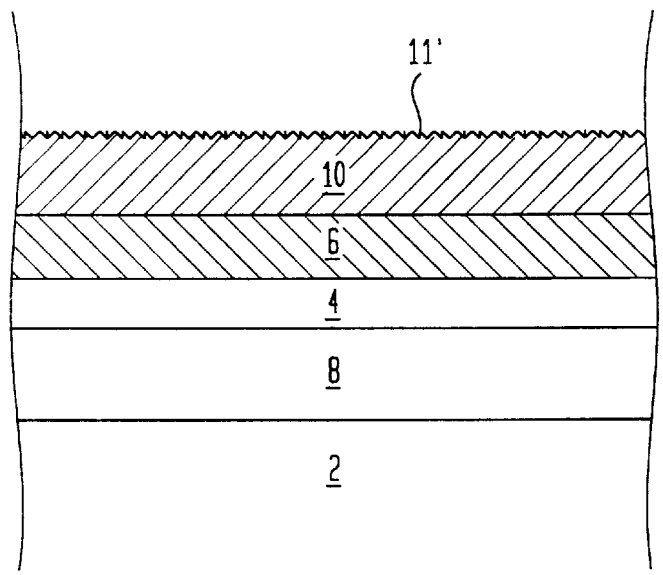

As shown in FIG. 3, a surface 11' having a roughened microstructure is produced on exposed surface 11 of bulk copper-containing film 10. Surface 11' has an extremely large micro-surface area. This spin-off process and etching operation also expose high crystallographic index planes in the plated copper film.

Figure 4:
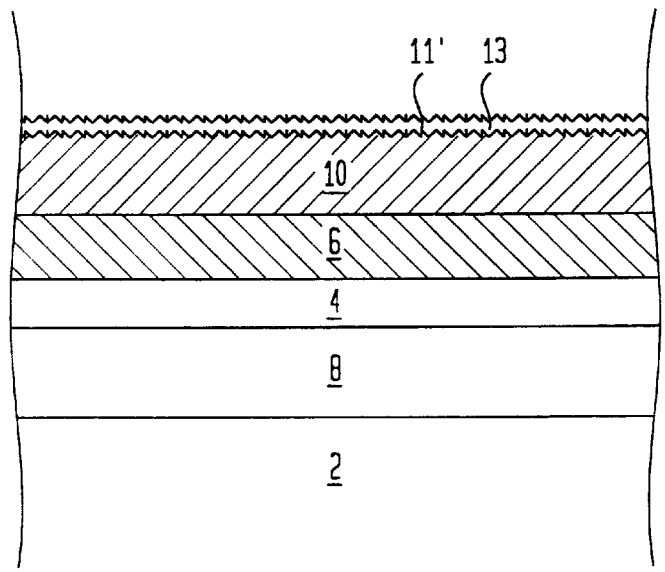

Now turning to FIG. 4, after the spin-off and etching operation has been completed, the substrate is next submerged into the electroplating solution. Before electroplating current is applied, however, the substrate is re-introduced into the plating solution and rotated using a rotation rate of 5 to 400 rpm. In the preferred embodiment, the rotation rate may range from 10 to 90 rpm for a period of 2 to 30 seconds. In the preferred embodiment, this dwell time will be within the range of 2 to 20 seconds. During this time, a minimal current of 3 to 5 mA/cm$^2$, which is much less than the electroplating current, may be applied, or the solution may be maintained in an electrically neutral state during this lamination step. During this dwell period before the electroplating current is applied, the additives from the bath adsorb onto the large micro-surface area and the high crystallographic planes created on surface 11' by the prior step.

In this manner, an impurity film 13 is laminated onto the first bulk copper-containing film 10 of the composite film of the present invention. More specifically, an impurity film 13 is laminated onto the surface 11' formed on the surface of the first deposited bulk copper-containing film 10. The additives contained in the plating solution are preferentially absorbed from the solution and onto the copper microstructure of surface 11' during this lamination process. Thus, a thin film containing an increased impurity content is laminated onto the microstructure to provide a discrete region of high impurity concentration within a composite film structure. This region of high impurity concentration has a higher impurity concentration than a corresponding impurity concentration within a bulk film produced by electroplating from the same electroplating solution.

The concentration of impurities, within the laminated impurity film 13 produced on surface 11' within the composite copper-containing film, may vary from the concentration of an impurity within a bulk electrodeposited film formed from the same electroplating solution (as in Table 1), up to sub-monolayer values. In the preferred embodiment, in which the first bulk electrodeposited film includes impurities from the electroplating bath, the concentration of the same impurities formed from the same electroplating bath within the laminated impurity film will be significantly greater. The maximum concentration range of impurities such as carbon, oxygen, nitrogen, and sulfur is approximately $1\times10^{13}$ to $1\times10^{14}$ atoms/cm$^2$.

Figure 5:
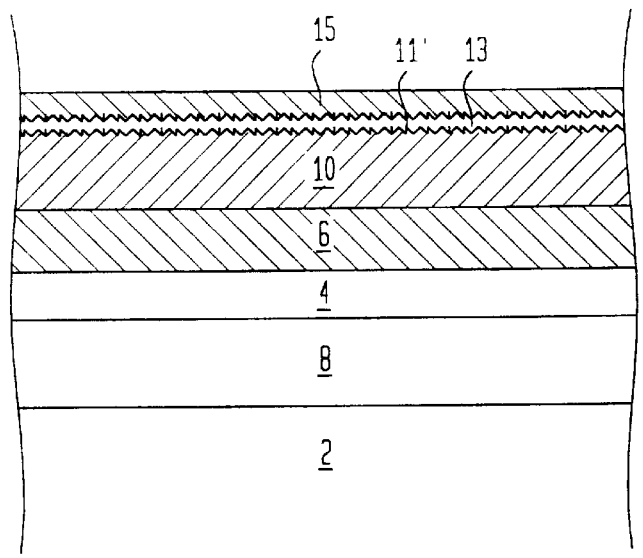

Now turning to FIG. 5, after this brief dwell period during which impurity film lamination occurs, and while still in the electroplating solution, an electroplating current is applied to the cathode to form another electrodeposited bulk copper film 15 and to continue the film formation process. The electroplating time is determined by the required total film thickness of the composite film. The electroplating process details may be the same as described above in conjunction with the formation of bulk copper-containing film 10. Likewise, the film characteristics of the electroplated film 15 such as the impurity content will also be as described in conjunction with bulk copper-containing film 10. Through the use of the described operating sequence of film formation, spin and etch, dwell, and electroplate, a film having a high concentration of impurity such as carbon, oxygen, sulfur, and nitrogen is laminated within the composite copper film.

Figure 6:
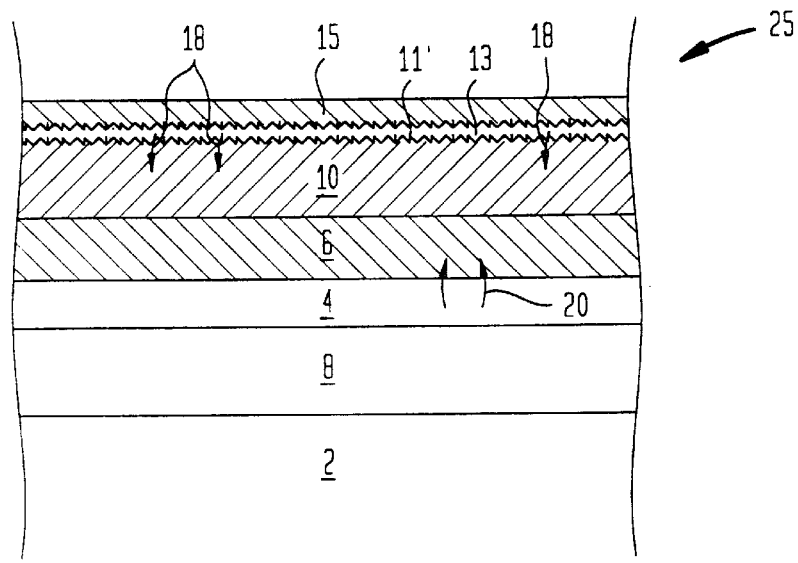

Now turning to FIG. 6, composite film 25 includes barrier film 4, copper alloy seed layer 6, bulk copper-containing film 10 with roughened surface 11', laminated impurity film 13, and electrodeposited bulk copper film 15. After the substrate is removed from the electroplating solution and dried, composite film 25 is next annealed. In an exemplary embodiment, the substrate may be rinsed after removal from the electroplating solution and prior to drying. The annealing process takes place in an inert ambient environment such as nitrogen, forming gas, or hydrogen. The annealing times may range from 2 to 180 minutes and, in the preferred embodiment, they may range from 5 to 150 minutes. In the preferred embodiment, the temperature range may vary from 100 to 500° C., but temperatures as high as 600° C. may be used. As the temperature is increased, the necessary time for the annealing process to occur will be decreased accordingly. According to one exemplary embodiment, composite film 25 may be annealed at a temperature within the range of 250° C.–500° C. at a time within the range of 30 to 60 minutes.

During the heat treatment, the minor components of the alloy seed layer 6 such as indium, tin, titanium, chromium, or other species, which will diffuse faster than copper atoms, diffuse away from the alloy seed layer 6 and form intermetallic materials. This diffusion is shown as arrows 20 in FIG. 6. As shown by arrows 20, these species diffuse away from the alloy seed layer 6 and toward the electro-laminated impurities contained in impurity film 13. These materials from the copper alloy seed layer 6 interact with the impurities contained in laminated impurity film 13 to form chemical compounds and complexes such as indium oxides, tin oxides, Cu—In—O complex, Cu—Sn—O complex, chromium oxides, titanium oxides, aluminum oxides, and various other complexes depending on the additives and impurities used.

Although oxygen may be the preferred impurity species contained within laminated impurity film 13, carbon, nitrogen, and sulfur may be additionally or alternatively used in alternate embodiments. As such, chemical compounds and complexes including carbon, nitrogen, and sulfur may also be formed from the interaction between the additive material from the alloy seed layer 6 and the impurity contained in impurity film 13. Arrow 18 of FIG. 6 represents the direction of travel of the impurity species from laminated impurity film 13, as the species diffuses to interact with the additive from the alloy seed layer 6. The direction and path of diffusion, as well as the location of the compounds and complexes formed, will be along the grain boundaries of bulk copper-containing film 10.

Figure 7:
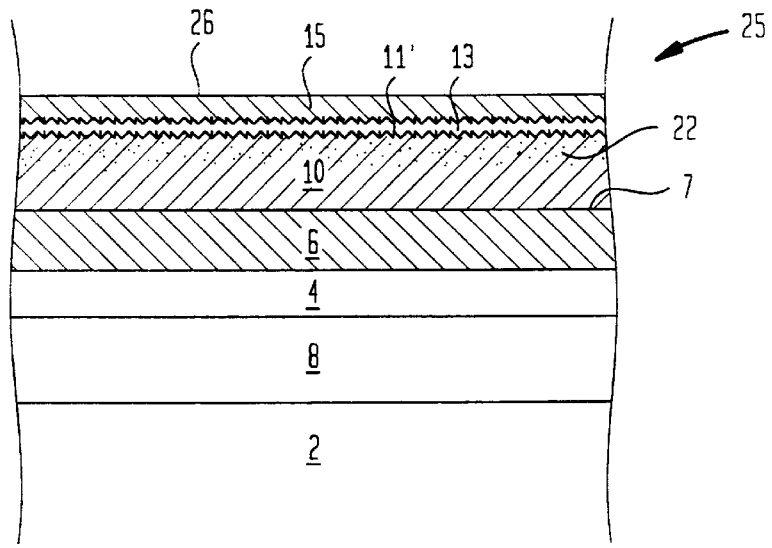

Now turning to FIG. 7, the first embodiment of composite film 25 of the present invention includes the compounds and complexes as above which are formed during the heat treatment process. The interstitial locations of these compounds and complexes, formed along the grain boundaries, are preferentially in region 22 which is nearer the laminated impurity film 13 than the surface 7 of alloy seed layer 6. The compounds tend to form toward the exposed surface 26 of the composite film 25 and away from substrate 2. As the annealing temperature is increased, the formed compounds may be disposed between original impurity film 13 and exposed surface 26 as the location of region 22 moves closer to exposed surface 26.

The presence of the partially soluble and insoluble intermetallic materials in the heat-treated, deposited, metal, composite film 25 produces a microstructure which includes high twinning density (multiple twins per grain) and includes the intermetallics preferentially located along the grain boundary regions near the copper composite film surface 26. The presence of these intermetallic materials, along copper grain boundaries and near the surface 26, reduces copper grain boundary growth and copper atom surface mobility. The interaction of the impurities and the high twinning density within the copper grain structure enhance the electro-migration lifetime of the entire interconnect composite film 25. The composite film 25 as formed will require a greater amount of energy to cause a majority of copper atoms to migrate preferentially in any given direction, and hence to cause electromigration failures.

Figure 8A:
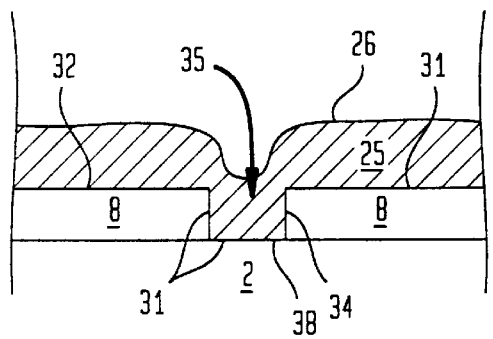
FIGS. 8A, 8B, 8C, and 8D are cross-sectional views showing various substrate structures onto which the composite film of the present invention may be formed.

The composite film 25 may be formed into a pattern by use of any of the mechanisms as described above. The composite film may be formed on a substantially flat surface and patterned thereafter, or it may be inlaid within a trench or other damascene structures. Typical examples of patterning processes appear in FIGS. 8A, 8B, 8C, and 8D. FIG. 8A shows a cross-section of an embodiment in which the damascene patterning process is used. A trench 35 is formed within the dielectric layer 8 formed on substrate 2. The composite metal film 25 of the present invention is formed over exposed surfaces 31 which include the side walls 34 and bottom surface 38 of the trench 35, and the top surface 32 of the dielectric film B. A pattern, including the portion of composite film 25 disposed within trench 35, may be is formed using conventional damascene processes.

Figure 8B:
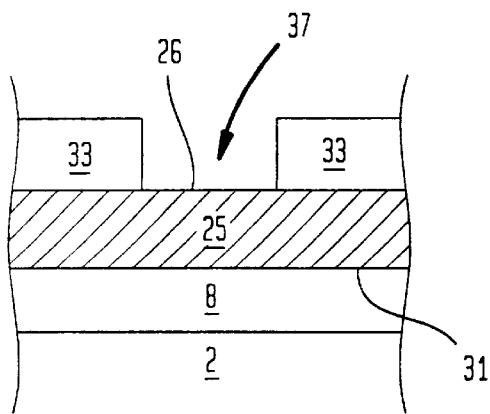

FIG. 8B shows a cross-section of the composite film 25 of the present invention formed on the dielectric layer 8 on the substrate 2. Photoresist pattern 33 is formed on top surface 26 of composite film 25. Conventional etching mechanisms may be used to remove the portions of composite film 25 which are in the exposed region 37. After etching is complete, photoresist 33 may be removed by any suitable process typical in the art.

Figure 8C:
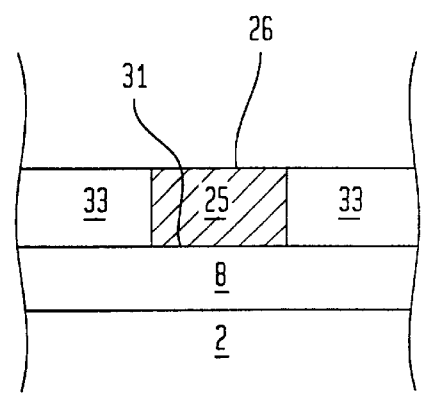

FIG. 8C shows application of the present invention to form composite film 25 using the "plate-through" process of patterning. In this application, a photoresist pattern 33 is formed on the dielectric material 8 on the substrate 2. Next, the remaining layers of the composite film 25 of the present invention are selectively formed on exposed surface 31. After the composite film 25 is formed, photoresist 33 may be removed by any suitable process typical in the art, to produce a pattern within composite film 25.

Figure 8D:
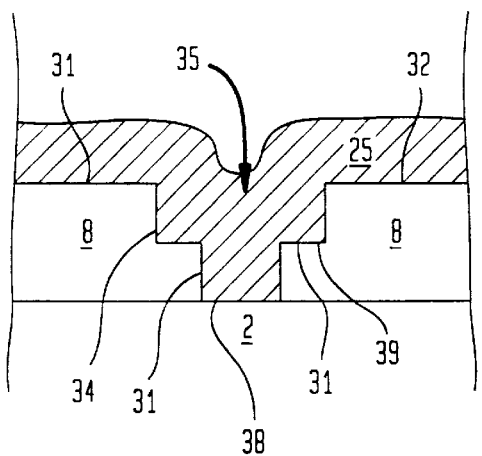

FIG. 8D shows a cross-section of an embodiment in which a damascene patterning process is used with a dual damascene structure. A trench 35 is formed within the dielectric layer 8 formed on substrate 2. The composite metal film 25 of the present invention is formed over exposed surfaces 31 which include the side walls 34, lip sections 39, and bottom surface 38 of the trench 35, and the top surface 32 of the dielectric film 8. A pattern, including the portion of composite film 25 disposed within trench 35, may be formed using conventional damascene processes.

Example 2

Multiple Alloy Seed Layers

Figure 9:
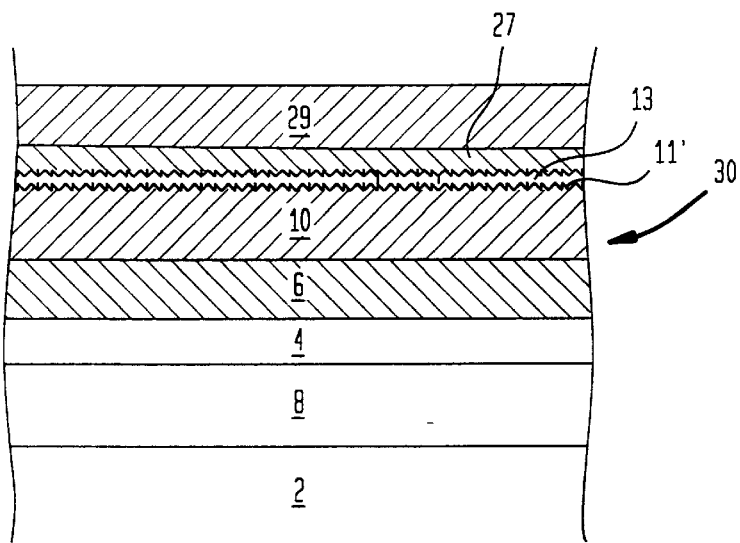
FIG. 9 and FIG. 10 are cross-sections showing two different structures formed according to another exemplary embodiment of the present invention, with FIG. 9 illustrating a cross-sectional view of a composite film structure including two bulk deposited films and FIG. 10 illustrating a cross-sectional view of a composite film including one bulk deposited film.

A further aspect of the present invention is directed to a process for producing multiple metal layers having different microstructures or textures. Referring to FIG. 9, the composite film 30 includes an alloy seed layer 6, a bulk deposited copper-containing film 10, and a laminated impurity film 13 all as described in conjunction with Example 1. In the preferred embodiment, a barrier layer film 4 may also be included. The barrier layer film 4 is disposed between the dielectric film 8 on substrate 2 and the first alloy seed layer 6. In this exemplary embodiment, bulk copper-containing film 10 may be formed using processes such as PVD, CVD, electroless plating, and others. In the preferred embodiment, electrodeposition is used to form bulk copper-containing film 10.

After high impurity content impurity film 13 has been formed over roughened surface 11', a second alloy seed layer 27 is formed. The second alloy seed layer 27 may be deposited by immersion plating, electroless plating, PVD, CVD, or other metal deposition processes. In the preferred embodiment, this second alloy seed layer 27 may be comprised of a copper tungsten alloy, a nickel phosphorus alloy, a CoP/NiP alloy, or an immersion tin layer. In alternate embodiments, other materials may also be suitable. The thickness of this second alloy seed layer 27 may range from 25 to 500 angstroms, but will range from 25 to 200 angstroms in the preferred embodiment.

Second bulk film 29 is formed over second alloy seed layer 27. Second bulk film 29 is comprised of copper is and is formed by electroplating in the preferred embodiment. In an alternate embodiment, second bulk film 29 may comprise gold, a Pb—Sn alloy, other solderable alloys, or other materials. After formation, the composite metal film structure is annealed. The annealing takes place in an inert ambient. During this heat-treatment step, additive materials from the first alloy seed layer 6 diffuse through first deposited bulk copper-containing film 10 and interact with the impurities contained within laminated impurity film 13, materials from second alloy seed layer 27, or both to form intermetallics. As described in conjunction with the first example, the impurity species contained within laminated impurity film 13 may be oxygen in the preferred embodiment, but may be nitrogen, sulfur, carbon, or other materials in an alternative embodiment.

Example 3

Second Alloy Seed Layer Followed by Annealing

Figure 10:
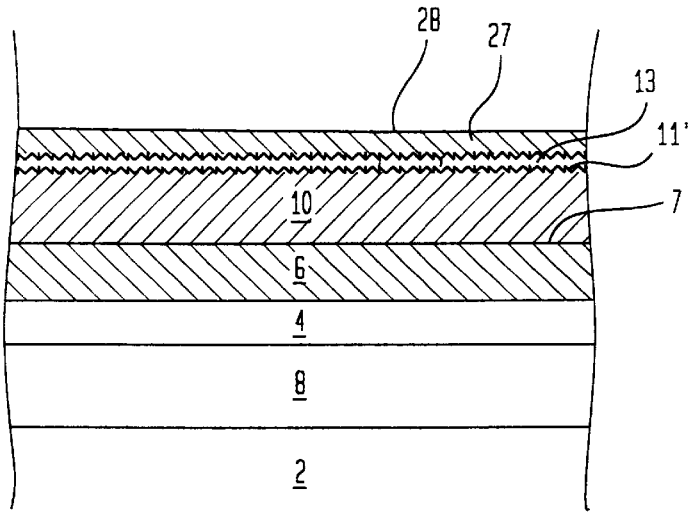

Now turning to FIG. 10, another exemplary embodiment of the present invention may include the second alloy seed layer 27 and the underlying structure as described in conjunction with Example 2, but will not include any subsequently deposited film over the top surface 28 of the second alloy seed layer 27. Rather, after formation of second alloy seed layer 27, the structure is subjected to heat treating. In the preferred embodiment, this second alloy seed layer 27 may be comprised of a copper tungsten alloy, a nickel phosphorus alloy, a CoP/NiP alloy, or an immersion tin layer. In alternate embodiments, other materials may also be suitable.

The heat-treatment step may be the annealing process as described above, in the preferred embodiment. During the heat-treatment step in an ambient environment, fast-diffusing atomic species from the lower first alloy seed layer 6 diffuse through first bulk copper-containing film 10 and toward laminated impurity film 13 and second alloy seed layer 27. Impurities such as indium, tin, titanium, and chromium from first seed layer 6 interact with the laminated impurities within film 13, impurity species from second alloy seed layer 27, or both to form intermetallic materials including compounds and complexes. The intermetallic materials will be formed in or near the regions of the laminated impurity film 13 and second alloy seed layer 27. The presence of these intermetallic material compounds or complexes near the surface of the bulk copper-containing film 10 suppresses the surface mobility of copper grains, thus enhancing the electromigration resistance of the composite structure.

Example 4

In-situ Barrier Film Formation

Another example of the present invention is directed to a process for forming a barrier film in-situ on a semiconductor substrate or packaging structure. This process of the present invention allows for the use of materials which by their nature may not otherwise be suitable barrier materials. By disposing these typically unsuitable barrier materials in a location whereby films of other materials may be deposited adjacent to them, these unsuitable barrier materials may interact or complex with materials from the adjacent films to form a new material which possesses adequate barrier properties.

Figure 11:
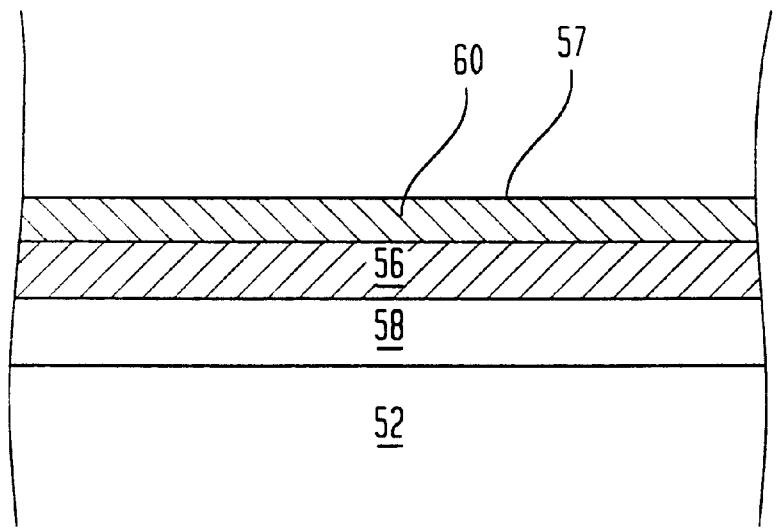
FIGS. 11 through 15 are cross-sectional views showing the process sequence used to form another exemplary embodiment of the present invention. More specifically.

Now referring to FIG. 11, substrate 52 has a dielectric material 58 and an alloy seed layer 56 disposed on substrate 52. The alloy seed layer 56 is a copper alloy including copper and indium, chromium, titanium, or tantalum as the minor component within the alloy. The concentration of the minor component within the alloy may vary from 0.2 to 10 atomic percent. In the preferred embodiment, the concentration may lie between 0.2 to 5 atomic percent. The thickness of the alloy seed layer 56 may range from 10 to 200 angstroms, but will lie within 10 to 150 angstroms in the preferred embodiment.

The alloy seed layer 56 may be sputtered from a master alloy target in the preferred embodiment. In an alternative embodiment, the alloy seed layer 56 may be formed by co-sputtering, sputtering, co-evaporation, evaporation, immersion plating, electroplating, or other processes. Over the alloy seed layer 56, a copper seed layer 60 is formed. The copper seed layer 60 may be formed by sputtering or CVD (chemical vapor deposition) processes. The thickness of the copper seed layer 60 may range from 50 to 1,500 angstroms, and in the preferred embodiment will range between 100 and 1,000 angstroms. Copper seed layer 60 has an exposed surface 57.

Figure 12:
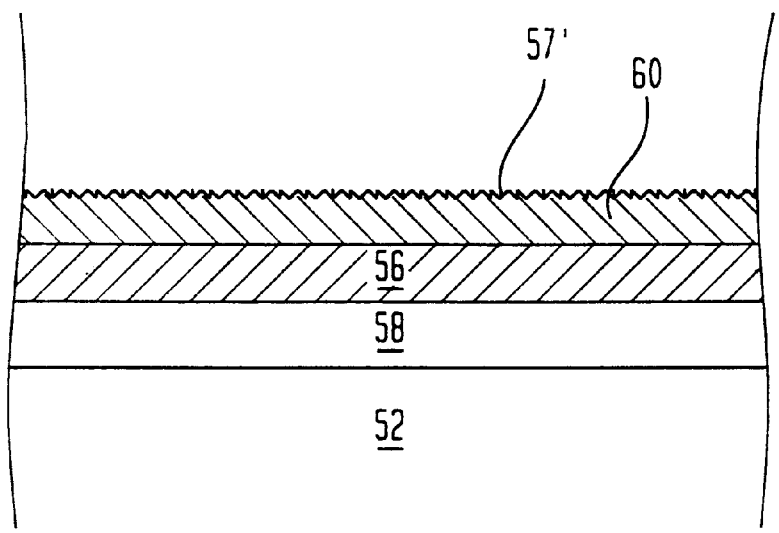

Now turning to FIG. 12, the surface 57 of the copper seed layer 56 is modified in a suitable electroplating bath by the spin-etch process, as described in conjunction with Example 1, to form a roughened surface 57'. Roughened surface 57' has exposed, high-index crystallographic planes.

Figure 13:
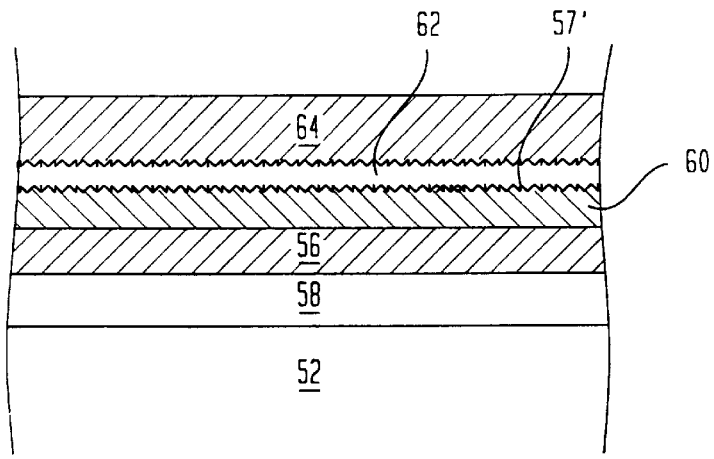

As shown in FIG. 13, a high impurity content film 62 is next laminated onto roughened surface 57'. The procedure for forming the high impurity content film 62 is as described in conjunction with Example 1. Impurities which may be laminated onto the structure in this process include carbon, sulfur, oxygen, nitrogen, and, in the preferred embodiment, a combination of oxygen, nitrogen, and carbon. A bulk copper-containing film 64 is then electrodeposited over the laminated high impurity content film 62. Any suitable process for electroplating which is known in the art may be used for this purpose.

Figure 14:
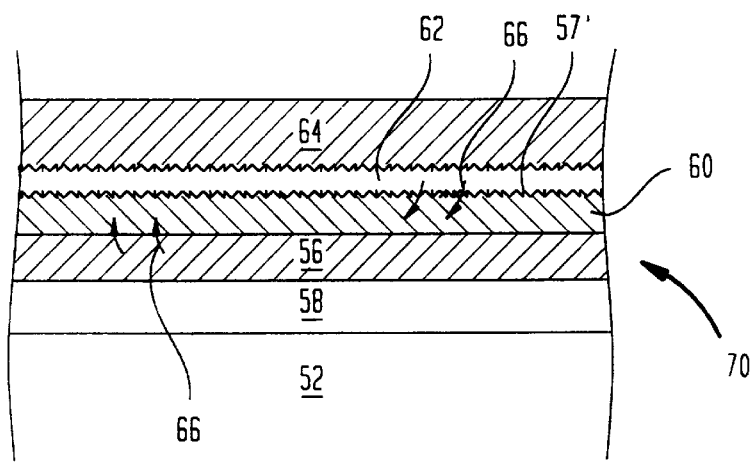

Now turning to FIG. 14, the composite structure 70 is then annealed. The annealing process takes place in an inert ambient such as air or nitrogen, at temperatures ranging from 100 to 550° C., and preferably within the range of 200 to 500° C. The annealing time may range from 10 minutes to 3 hours, and in an exemplary embodiment may range from 30 minutes to 180 minutes. During this heat treatment, the laminated impurities from high impurity content film 62 interact with the materials in the alloy seed layer 56. Arrows 66 represent the direction of inter-diffusion between the materials of the respective films. This interaction of materials from respective films results in the formation of a barrier material.

Figure 15:
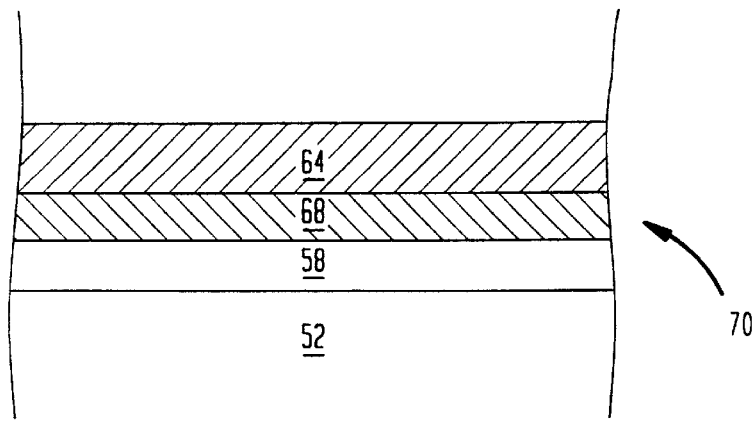

The heat treatment produces barrier film 68 as shown in FIG. 15. In this manner, a barrier film 68 with adequate barrier layer properties has been formed, in-situ, from materials which otherwise would be unsuitable for barrier purposes. Examples of barrier materials formed in this manner include Cu(O), CuTiO, CuCr(O), and their complexes with nitrogen, carbon, or sulfur. Other barrier materials may be produced, depending on the additives incorporated into the seed layer (56 in FIG. 11) and the impurities added via laminated high impurity content film 62 in FIG. 13. In the composite film structure 70, the composite film includes bulk copper-containing film 64 and barrier film 68. FIG. 15 shows this composite film disposed upon a semiconductor substrate 52.

As with the previous embodiments, after the composite film structure is completed, a pattern is formed within the film to produce a wiring pattern. In the preferred embodiment, one of the processes for patterning, as described previously, may be used to form the pattern. Any suitable process may be used, however, for forming a pattern of a composite metal film.

Although the invention is illustrated and described above with reference to specific embodiments and examples, the invention is not intended to be limited to the details shown. Rather, various modifications and additions may be made in the details within the scope and range of equivalents of the claims and without departing from the invention. The processes and films described above may be used in various combinations to form a number of composite copper-containing films with desirable thermo-mechanical, electrical, and metallurgical properties. The impurities introduced and disposed within the composite film structure also provide a composite copper-containing film with superior electromigration resistance. The processes could be used in conjunction with other platable materials, such as Au, Ni, Cr, and other materials used to fabricate structures for semiconductor packaging, or other high temperature applications.

The details of the processes used to form the structures of the present invention may also differ, from the process parameters detailed above, and still remain within the scope of the present invention. Furthermore, the final film structure may be varied and remain within the scope of the present invention.

What is claimed:

1. A process for forming a copper-containing film, comprising the steps of:

(a) forming a seed layer at least indirectly on a semiconductor substrate, said seed layer including copper and an additive;

(b) forming a bulk copper-containing film on said seed layer, said bulk copper-containing film including associated grain boundaries and an exposed surface;

(c) contacting said exposed surface with an electroplating solution and mechanically removing said electroplating solution from said surface within an oxygen environment, thereby roughening said exposed surface;

(d) laminating an impurity film onto said exposed surface by immersing said substrate in said electroplating solution, said impurity film including copper and an impurity and having a first impurity concentration;

(e) forming a further bulk copper-containing film on said impurity film, said further bulk copper-containing film including said impurity, a second impurity concentration, associated grain boundaries, and a further exposed surface;

(f) drying said substrate; and (g) annealing said substrate to form a plurality of compounds disposed along said grain boundaries, the majority of said plurality of compounds including said additive and said impurity in combination;

wherein said first impurity concentration is greater than said second impurity concentration.

2. The process as in claim 1, further comprising the step (d1) of removing said substrate from said electroplating solution and drying said substrate.

3. The process as in claim 1, wherein said bulk copper-containing film further includes said impurity and a third impurity concentration, and said first impurity concentration is greater than each of said second impurity concentration and said third impurity concentration.

4. The process as in claim wherein at least one of said bulk copper-containing film or said further bulk copper-containing film is formed by a mechanism selected from the group consisting of electroless plating, chemical vapor deposition, and physical vapor deposition.

5. The process as in claim 1, further comprising the step of forming a wiring pattern within said copper-containing film as one of step (f1) and step (h).

6. The process as in claim 1, wherein said roughening comprises forming high index crystallographic planes within said exposed surface.

7. The process as in claim 1, further comprising the step of interposing a barrier layer film between said seed layer and said semiconductor substrate.

8. The process as in claim 1, wherein said step of mechanically removing said electroplating solution comprises spin drying said substrate.

9. The process as in claim 1, wherein said annealing is carried out at a temperature within the range of 250° C. to 500° C. at a time within the range of 30 to 60 minutes.

10. The process as in claim 1, further comprising applying an electrical current within the range of 3 mA/cm$^2$ to 5 mA/cm$^2$, to said plating solution during said step of laminating.

11. The process as in claim 1, wherein said electroplating solution is maintained in an electrically neutral state during said step of laminating.

12. The process as in claim 1, wherein said annealing is carried out in an inert atmosphere, said inert atmosphere comprising one of forming gas, air, and nitrogen.

13. The process as in claim 1, wherein at least one of said bulk copper-containing film or said further bulk copper-containing film is formed by electroplating.

14. The process as in claim 13, wherein said electroplating is carried out using said electroplating solution.

15. A process for forming an electrodeposited copper-containing film, comprising the steps of:

(a) forming a seed layer at least indirectly on a semiconductor substrate, said seed layer including copper and an additive;

(b) immersing said substrate in an electroplating solution;

(c) electrodepositing a first bulk copper-containing film from said electroplating solution onto said seed layer, said first bulk copper-containing film including an impurity, a first impurity concentration, associated grain boundaries, and an exposed surface;

(d) removing said substrate from said electroplating solution and mechanically removing said electroplating solution from said bulk copper-containing film within an oxygen environment, thereby roughening said exposed surface;

(e) laminating an impurity film onto said exposed surface by immersing said substrate in said electroplating solution, said impurity film including copper, said impurity, and having a second impurity concentration;

(f) electrodepositing a second bulk copper-containing film from said electroplating solution onto said impurity film, said second bulk copper-containing film including said impurity, a third impurity concentration, associated grain boundaries, and a second exposed surface;

(g) removing said substrate from said electroplating solution;

(h) rinsing then drying said substrate; and (i) annealing said substrate to form a plurality of compounds disposed along said grain boundaries, the majority of said plurality of compounds including said additive and said impurity in combination;

wherein said second impurity concentration is greater than each of said first impurity concentration and said third impurity concentration.

16. A process for forming a copper-containing film, comprising the steps of:

(a) forming a first seed layer at least indirectly on a semiconductor substrate, said seed layer including copper and an additive;

(b) forming a bulk copper-containing film on said seed layer, said bulk copper-containing film including an exposed surface;

(c) contacting said exposed surface with an electroplating solution and mechanically removing said electroplating solution from said surface within an oxygen environment, thereby roughening said exposed surface;

(d) laminating an impurity film onto said exposed surface by immersing said substrate in said electroplating solution, said impurity film including an impurity;

(e) forming a second seed layer at least indirectly on said exposed surface; and (f) annealing said substrate to diffuse said additive within said copper containing film.

17. The process as in claim 16, wherein said step of forming a bulk copper-containing film comprises one of physical vapor deposition, chemical vapor deposition, electroless plating, and electrodeposition.

18. The process as in claim 16, wherein said step of forming a second seed layer comprises one of immersion plating, electroless plating, physical vapor deposition, and chemical vapor deposition.

19. The process as in claim 16, wherein said roughening comprises exposing high crystallographic planes within said exposed surface.

20. The process as in claim 16, wherein said impurity comprises one of carbon, oxygen, nitrogen, and sulfur, and said annealing causes an interaction between said additive and said impurity.

21. The process as in claim 16, further comprising interposing a barrier layer film between said first seed layer and said semiconductor substrate.

22. The process as in claim 16, further comprising the step (e1) of forming a second bulk film on said second seed layer, and wherein said second seed layer comprises copper and a further additive, and said annealing causes an interaction between said additive and one of said further additive and said impurity to form an intermetallic film.

23. The process as in claim 22, wherein said step of forming a second bulk film comprises electroplating.

24. The process as in claim 16, further comprising the step (e1) of forming a second bulk film on said second seed layer, and wherein said second seed layer comprises copper and a further additive, and said annealing causes an interaction between said additive and said further additive to form an intermetallic film.

25. The process as in claim 16 further comprising the step (g) of forming a wiring pattern within said copper-containing film.

26. A process for forming a barrier film, comprising the steps of:
  (a) forming an alloy seed layer at least indirectly on a substrate;
  (b) forming a copper seed layer on said alloy seed layer, said copper seed layer including an exposed surface;
  (c) contacting said exposed surface with an electroplating solution and mechanically removing said electroplating solution from said surface within an oxygen environment, thereby roughening said exposed surface;
  (d) laminating an impurity film onto said exposed surface by immersing said substrate in said electroplating solution, said impurity film including copper and an impurity;
  (e) electrodepositing a copper-containing film onto said impurity film; and
  (f) forming a barrier material by annealing said substrate to urge an interdiffusion between said alloy seed layer and said impurity.

27. The process as in claim 26, wherein said alloy seed layer is formed by one of evaporation, sputtering, co-sputtering, immersion plating, or electroplating.

28. The process as in claim 26, wherein said copper seed layer is formed by one of sputtering or chemical vapor deposition.

29. The process as in claim 26, wherein said annealing takes place at a temperature within the range of 100° C. to 550° C. and for a time within the range of 30 minutes to 180 minutes.

30. The process as in claim 26, wherein said annealing is conducted in an inert atmosphere comprising one of air and nitrogen.

31. The process as in claim 26, wherein said alloy seed layer comprises copper and at least one of chromium, indium, titanium, and tantalum.

32. The process as in claim 26, wherein said barrier material comprises one of Cu(O), CuTi(O), CuCr(O) or their associated complexes with nitrogen, carbon, and sulfur.

* * * * *

UNITED STATES PATENT AND TRADEMARK OFFICE
CERTIFICATE OF CORRECTION

PATENT NO. : 6,126,806
DATED : October 3, 2000
INVENTOR(S) : Cyprian E. Uzoh

It is certified that error appears in the above-identified patent and that said Letters Patent is hereby corrected as shown below:

<u>Column 13,</u>
Line 25, after the word "claim" insert -- 1 --.

Signed and Sealed this

Twenty-eighth Day of August, 2001

*Attest:*

*Attesting Officer*

NICHOLAS P. GODICI
*Acting Director of the United States Patent and Trademark Office*